United States Patent [19]
Yamagata

[11] Patent Number: 5,282,160
[45] Date of Patent: Jan. 25, 1994

[54] NON-VOLATILE SEMICONDUCTOR MEMORY HAVING DOUBLE GATE STRUCTURE

[75] Inventor: Yasushi Yamagata, Tokyo, Japan

[73] Assignee: Nec Corporation, Tokyo, Japan

[21] Appl. No.: 732,146

[22] Filed: Jul. 18, 1991

[30] Foreign Application Priority Data

Jul. 18, 1990 [JP] Japan .................. 2-189826

[51] Int. Cl.$^5$ .................. H01L 29/68; H01L 29/78
[52] U.S. Cl. .................. 365/185; 257/314;
257/316; 257/318; 257/324
[58] Field of Search ............. 365/185; 257/314, 316, 257/318, 324

[56] References Cited

U.S. PATENT DOCUMENTS

| 4,814,840 | 3/1989 | Kameda | 365/185 |
| 5,023,680 | 6/1991 | Gill et al. | 365/185 |
| 5,051,796 | 9/1991 | Gill | 365/185 |

Primary Examiner—Eugene R. LaRoche
Assistant Examiner—Viet Q. Nguyen
Attorney, Agent, or Firm—Laff, Whitesel, Conte & Saret

[57] ABSTRACT

A double gate non-volatile semiconductor memory comprises a plurality of device isolation regions formed of an insulator material filled into a plurality of trenches formed in a substrate, so that a device formation region is formed between each pair of adjacent device isolation regions. A side wall of an insulator material is formed to cover side surfaces of floating gates and word lines formed on the floating gates, which extend in a direction orthogonal to the direction of the device formation region. Source regions and drain regions are formed by doping impurity into the device formation regions surrounded by the side wall. A plurality of common source lines of a low resistance conductor film are formed each to extend in the orthogonal direction so as to pass on the source regions positioned in each one row of the orthogonal direction. Thus, the word lines are surely isolated from the source lines.

2 Claims, 13 Drawing Sheets

NON-VOLATILE SEMICONDUCTOR MEMORY HAVING DOUBLE GATE STRUCTURE

BACKGROUND OF THE INVENTION

1. Field of the Invention

The present invention relates to a non-volatile semiconductor memory having a double gate structure.

2. Description of Related Art

In the prior art, this type of semiconductor memory intended for a high integration density has been proposed by K. Sekiya et al in "1986 VLSI SYMPOSIUM" (Digest of Technology Paper, 1986 VLSI SYMPOSIUM, p87). In the proposed semiconductor memory, trenches are formed in a semiconductor substrate by etching, and device isolation regions are formed by filling up the trenches with an insulating material.

This structure is effective in increasing the integration density to a certain extent. However, a margin for an overlapping or alignment between a word line and the device isolation regions has been required so as to ensure that the word line never sticks out or protrudes from the device isolation regions into a source region. This is a hindrance in reducing the scale of the memory array in a widthwise direction of the word line. Particularly, in order to reduce the scale of the memory array in a widthwise direction of the word line, if the source region is reduced, a source resistance is inevitably increased, with the result that a writing characteristics and a read characteristics of memory cells are deteriorated.

SUMMARY OF THE INVENTION

Accordingly, it is an object of the present invention to overcome the above mentioned defect of the conventional double gate type non-volatile semiconductor memory.

Another object of the present invention is to provide a double gate type non-volatile semiconductor memory capable of increasing the integration density without deteriorating the characteristics of memory cells.

A further objection of the present invention is to provide a method of manufacturing a double gate type non-volatile semiconductor memory capable of increasing the integration density without deteriorating the characteristics of memory cells.

The above and other objects of the present invention are achieved in accordance with the present invention by a semiconductor memory comprising:

a substrate having a principal surface and a plurality of trenches formed in the principal surface separately from each other at a predetermined interval and to extend in a first direction;

a plurality of device isolation regions formed of an insulator material filled into the plurality of trenches, so as to form a device formation region between each pair of adjacent device isolation regions;

a plurality of floating gates formed at predetermined positions in the device formation region with a first gate oxide being interposed between a surface of the device formation region and each of the floating gates;

a plurality of word lines formed on the floating gates with a second gate oxide being interposed between each of the word lines and corresponding floating gates, the word lines extending in a second direction orthogonal to the first direction so as to intersect the device isolation regions;

a side wall formed of an insulator material so as to cover side surfaces of the word lines and the floating gates;

source regions and drain regions having doped impurities and formed in the device formation regions surrounded by the side wall;

a plurality of common source lines formed of a low resistance conductor film each extending in the second direction so as to pass on the source regions positioned in each one row of the second direction;

a connection layer formed of a low resistance conductor film and provided on each of the drain regions independently of the connection layer formed on the other drain regions;

an insulator layer formed to cover the common word lines and the connection layers and a plurality of data lines formed on the insulator layer to extend in the first direction, each of the data lines being connected to the connection layer above the drain regions positioned underneath the data line through a contact hole formed in the insulator layer on the connection layer.

According to another aspect of the present invention, there is provided a method of manufacturing a semiconductor memory comprising the steps of:

forming on a semiconductor substrate of a first conduction type a plurality of first lines extending in a first direction and separate from each other, each of the first lines being formed of a first insulator film formed on a principal surface of the semiconductor substrate and a first conductor film formed on the first insulator film;

forming between each pair of adjacent first lines a linear trench in the semiconductor substrate so as to extend in the first direction;

filling the trench with an insulator material so as to form a device isolation region;

forming on the first lines and the device isolation region a plurality of second lines extending in a second direction orthogonal to the first direction and separated from each other, each of the second lines being formed of a second insulator film formed on the first lines and the device isolation region and a second conductor film formed on the second insulator film;

etching the first lines in a self alignment to the second lines so that a plurality of floating gates are formed of the first lines independently of each other, doping impurities having a second conduction type opposite to the first conduction type, into the principal surface of the semiconductor substrate in a self alignment to the second lines so that a source region is formed on one side of each of the floating gates and a drain region is formed on the other side of the same floating gate;

depositing an insulator layer so as to cover a whole surface and etching back the deposited insulator layer so as to form a side wall of the insulator layer on a side surface of the second lines;

selectively doping silicon into the source regions and a surface of the device isolation regions in alignment with each row of the source regions in the second direction; and selectively growing a conducting material so that one conductor line is formed to extend over one row of the source regions in the second direction and the device isolation regions in alignment with the one row of the source regions and in an electrical contact with each of the source regions of the one row, and a discrete conductor layer is formed on each of the drain region.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
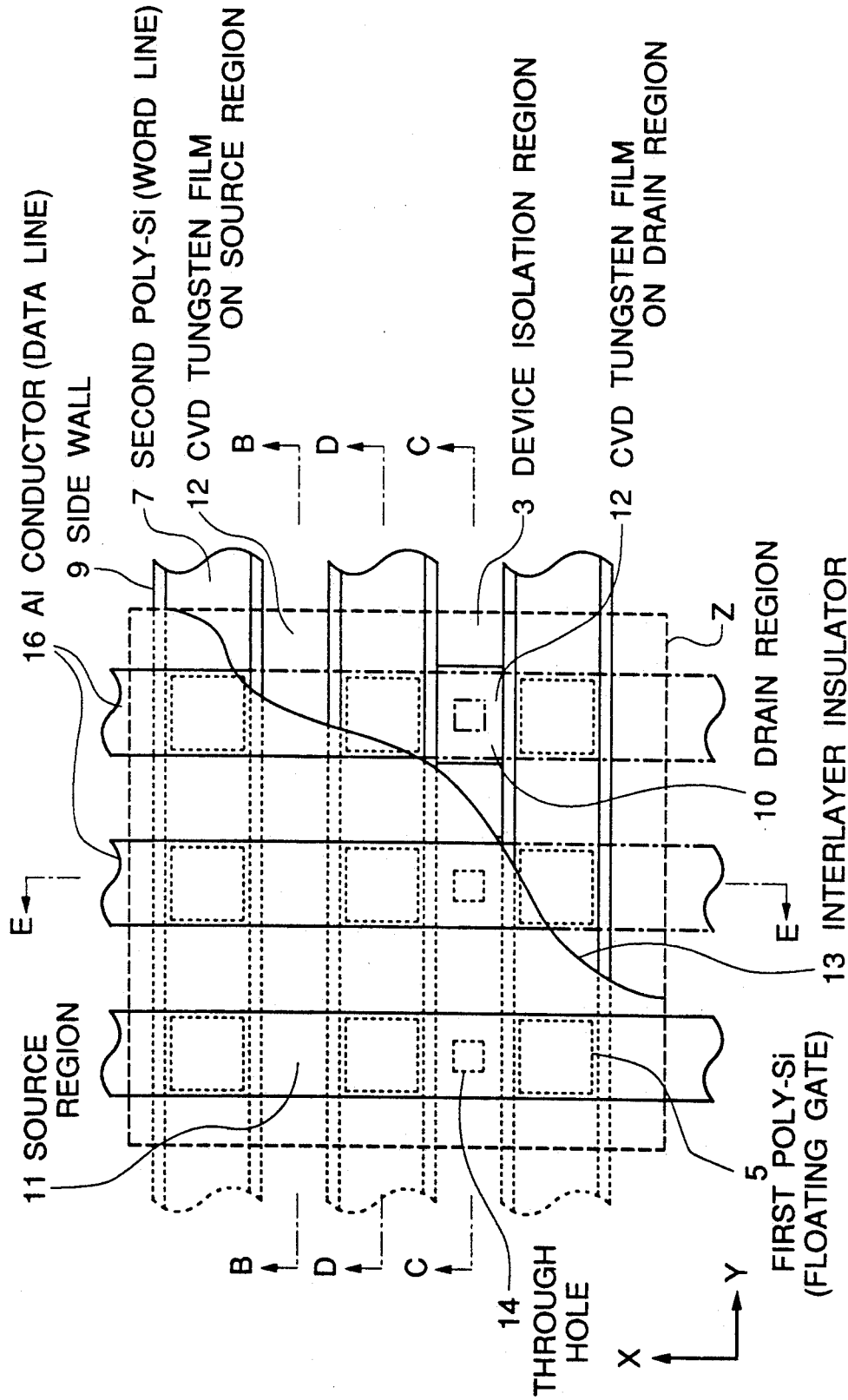
FIG. 1A is a partially broken, diagrammatic plan view of a first embodiment of the double gate type non-volatile semiconductor memory in accordance with the present invention.

Referring to FIG. 1A, there is shown a partially broken, diagrammatic plan view of a first embodiment of the double gate type non-volatile semiconductor memory in accordance with the present invention. FIGS. 1B, 1C, 1D and 1E are diagrammatic sectional views taken along the lines B—B, C—C, D—D and E—E in FIG. 1A within a square imaginary zone shown by a dotted line Z in FIG. 1A, respectively.

The shown semiconductor memory includes a P-type semiconductor substrate 1, in which a plurality of trenches 2 are formed to extend in a longitudinal direction X, separately from each other at equal intervals in a lateral direction Y perpendicular to the longitudinal direction X in the plan view of FIG.1A. These trenches 2 are filled with an oxide film so as to form a corresponding number of device isolation regions 3 extending in the longitudinal direction X, so that one device formation region extending in the longitudinal direction X is confined between each pair of adjacent device isolation regions 3.

Figure 1B:
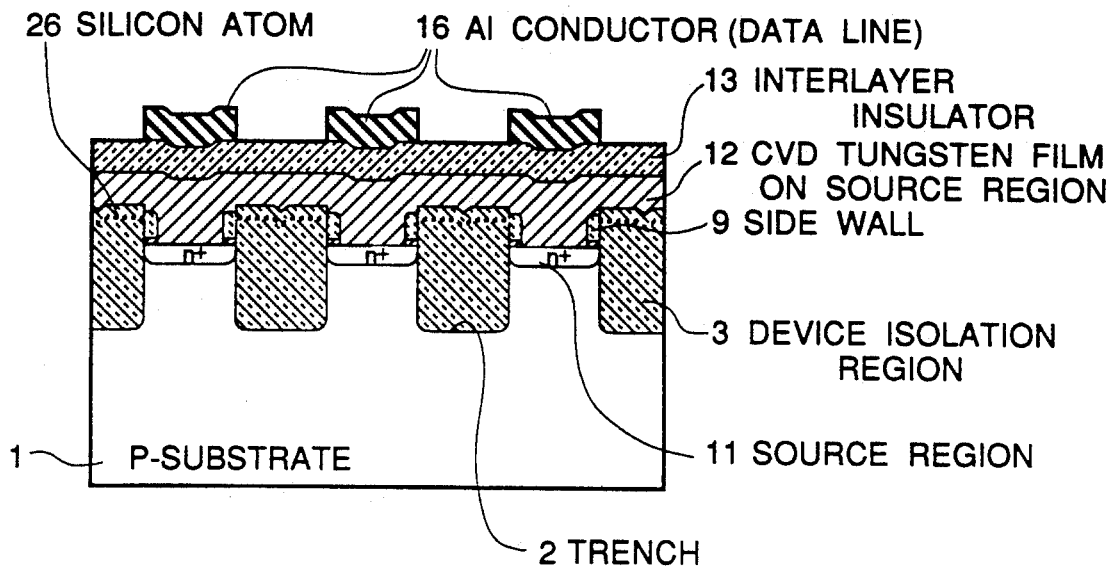
FIGS. 1B, 1C, 1D and 1E are diagrammatic sectional views taken along the lines B—B, C—C, D—D and E—E in FIG. 1A, respectively.
Figure 1C:
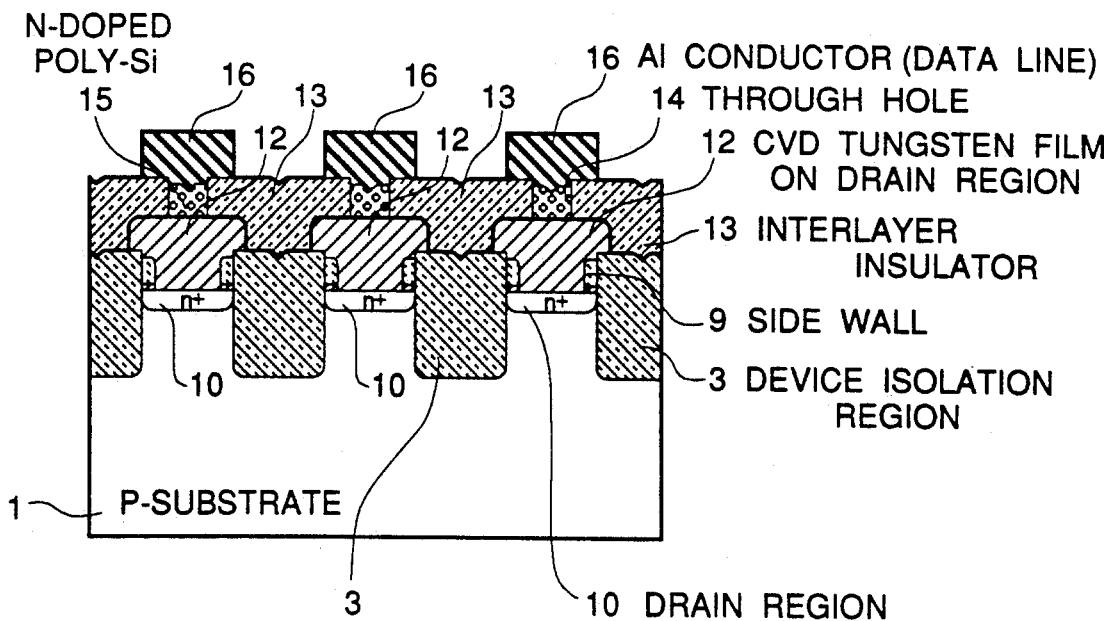
Figure 1D:
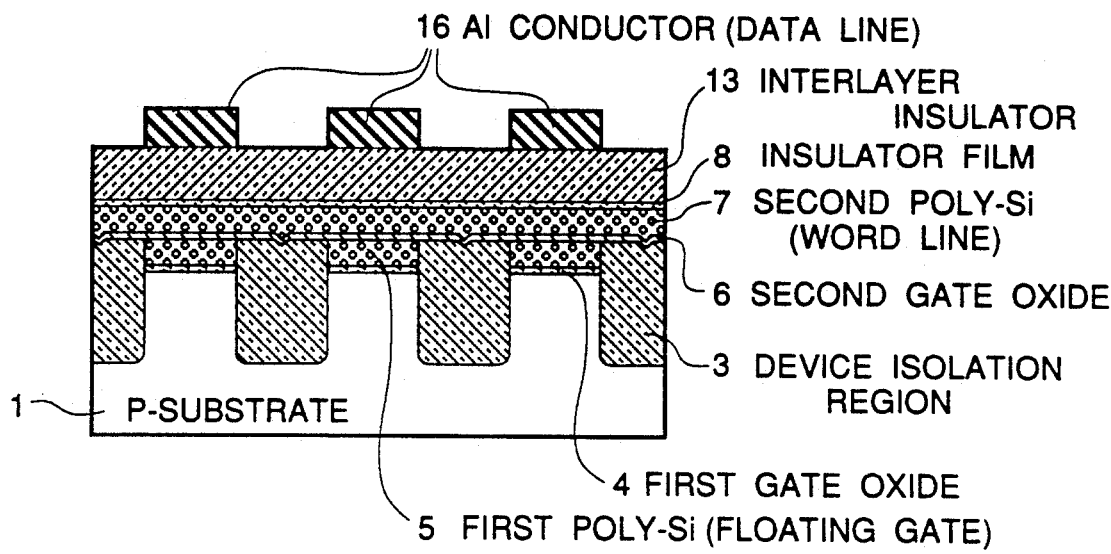
Figure 1E:
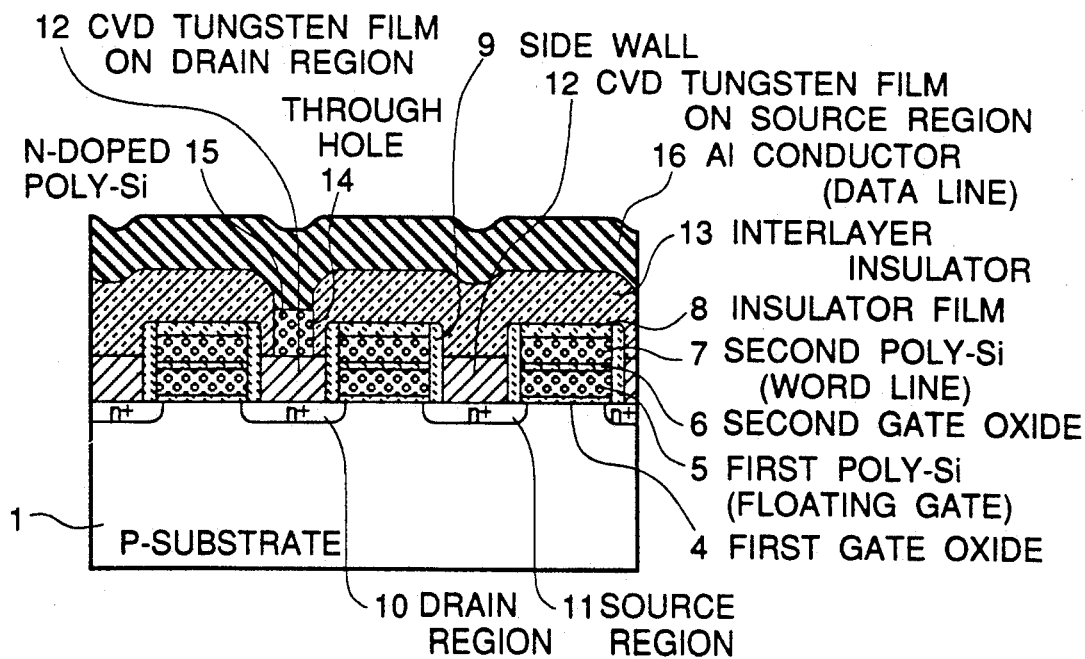

At predetermined separate positions in each of the device formation regions, there is provided a first gate oxide film 4 and a first polycrystalline silicon film 5 deposited in the named order on a surface of the substrate 1, as seen from FIGS. 1A and 1E. The first polycrystalline silicon film 5 forms a floating gate. A second gate oxide film 6 is deposited on the polycrystalline silicon 5 and to cover a whole surface, as seen from FIGS. 1D and 1E. As seen from FIGS. 1A and 1E, a plurality of stacked structures composed of a second polycrystalline silicon film 7 and an insulator film 8 is formed on the second gate oxide film 6 so as to overlay on the floating gate and to extend in the lateral direction Y. The second polycrystalline silicon films 7 form a word line (control gate). As seen from FIGS. 1E, a stacked structure composed of the floating gate 5 and the word line 7 has opposite side surfaces each of which is covered by a side wall 9 formed of an insulator film. This side wall 9 is also formed on each side surface of an upper portion of the device isolation regions 3, as seen from FIGS. 1B and 1C.

In each of the device formation regions, a drain region 10 and a source region 11 are formed at both sides of an area directly underneath each word line 7, by doping N-type impurity into the substrate excluding the areas directly underneath the word lines 7. On the drain region 10 and the source region 11, a CVD tungsten film 12 is formed as shown in FIGS. 1B, 1C and 1E. This CVD tungsten film 12 on the source regions 11 is continuous in the lateral direction Y so as to form a common source line, as shown in FIG. 1B, but the CVD tungsten film 12 on each drain region 10 is separated from the CVD tungsten films 12 on the other drain regions 10, as seen from FIG. 1C.

An interlayer insulator film 13 is formed to cover the whole surface of the substrate, and a contact hole 14 is formed above each of the drain regions so as to pierce through the interlayer insulator film 13. An N-doped polycrystalline silicon film 15 is filled into each through hole 14. A plurality of aluminum conductors 16 is formed on the interlayer insulator film 13 to extend in the longitudinal direction X and to pass over and make contact via the corresponding contact holes, as seen from FIG. 1A and 1E. This aluminum conductors 16 forms a data line. With this, a memory cell array is completed.

Now, one method of manufacturing the semiconductor device shown in FIGS. 1A to 1E will be described with reference to FIGS. 2A to 2Q.

Figure 2A:
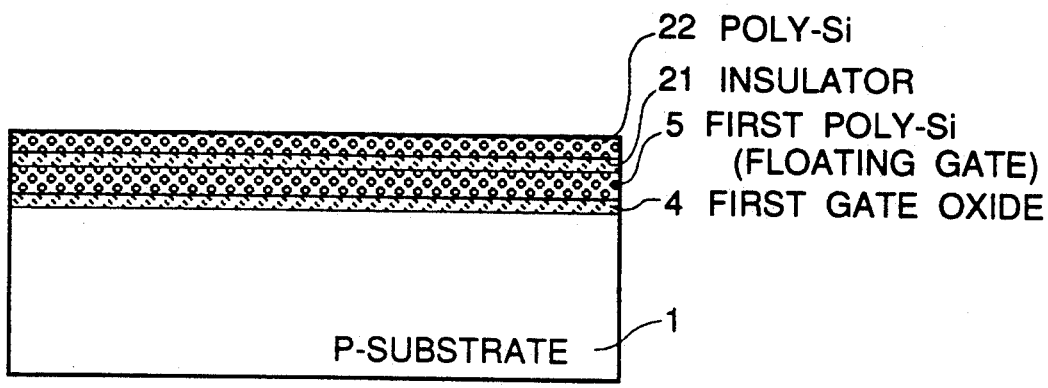
FIGS. 2A to 2Q are diagrammatic sectional views and plan views illustrating various steps of a first embodiment of the method for manufacturing the double gate type non-volatile semiconductor memory in accordance with the present invention.

As shown in FIG. 2A, on a P-type semiconductor substrate 1, a first gate oxide film 4 having a thickness of 50 Å to 300 Å, a first polycrystalline silicon film 5, an insulator film 21 and another polycrystalline silicon film 22 are deposited in the named order.

Figure 2B:
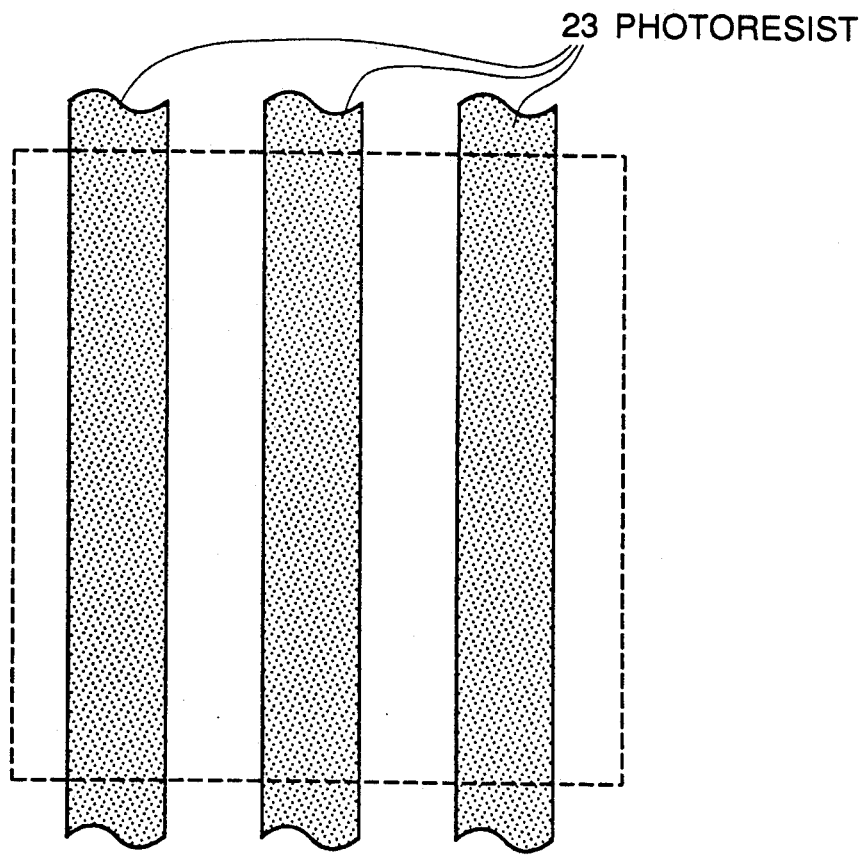
Figure 2C:
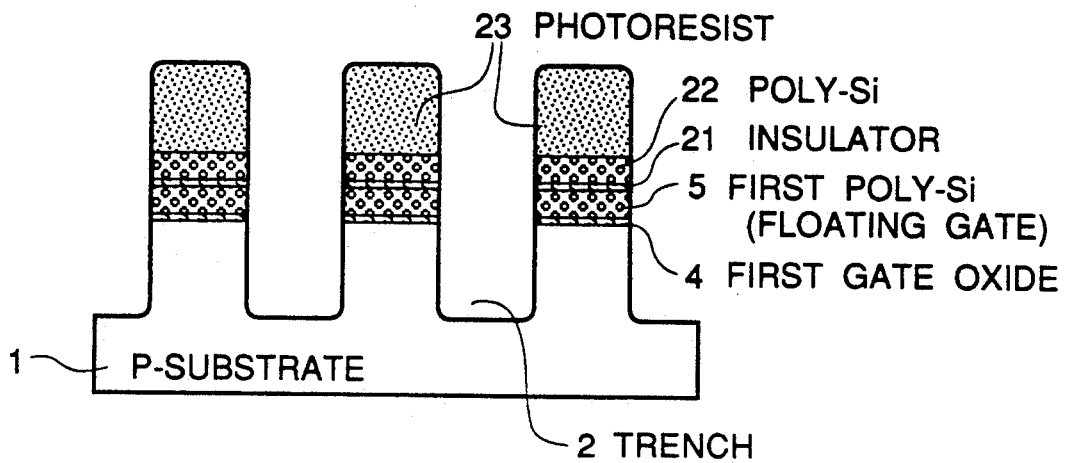

As shown in FIGS. 2B, a photoresist 23 having a stripe pattern in the longitudinal direction is formed by using a known photolithography technique, and then, as shown in FIG. 2C, by using the photoresist 23 as a mask, the polycrystalline silicon film 22, the insulator film 21, the first polycrystalline silicon film 5, and the first gate oxide film 4 are sequentially etched so as to form a plurality of longitudinal lines separated from and in parallel to each other and each having a stacked structure composed of the four layers 4, 5, 21 and 22. Further, the silicon substrate 1 exposed between the longitudinal lines is etched, so that a plurality of longitudinal trenches 2 having a depth of 1 μm to 3μm are formed in the substrate 1.

Figure 2D:
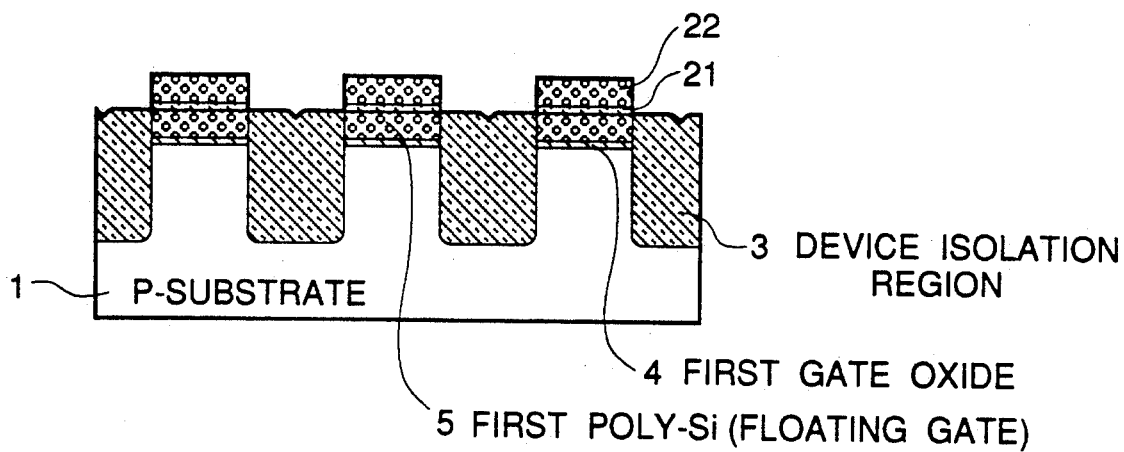

The photoresist 23 is removed. Thereafter, a CVD oxide film 3 having a thickness of about 2 μm is deposited by a chemical vapor deposition so as to completely cover a principal surface of the substrate, and the deposited oxide film is etched back until a surface of the polycrystalline silicon film 22 is exposed as shown in FIG. 2D. As a result, the trenches 2 are completely filled with the CVD oxide film, so that a plurality of line patterned device isolation regions 3 are formed. In this etch back process, the polycrystalline silicon film 22 functions to protect the underlying first polycrystalline silicon film 5, and to ensure that a surface of the device isolation regions 3 never becomes lower than an upper surface of the first polycrystalline silicon film 5.

Figure 2E:
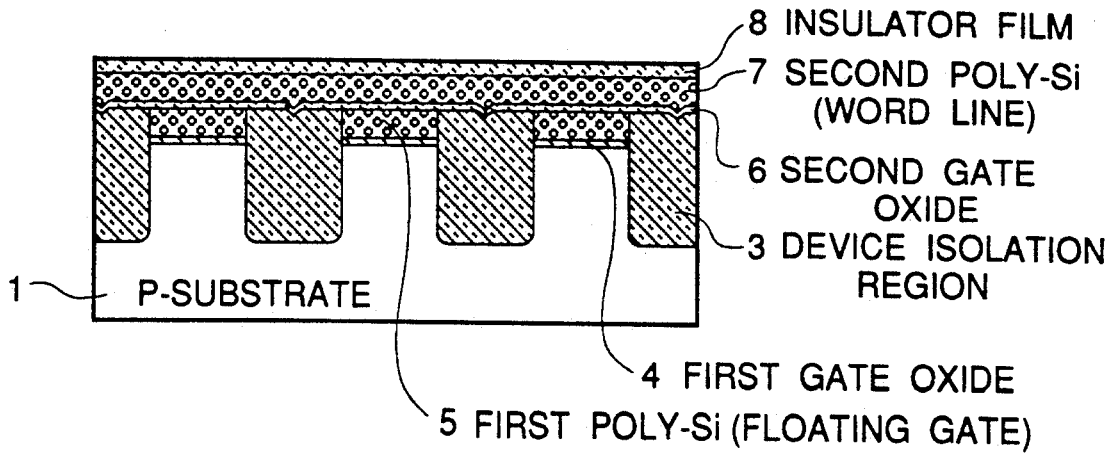

The polycrystalline silicon film 22 and the insulator film 21 are removed by an anisotropic etching, for example a RIE (reactive ion etching) method. Then, as shown in FIG. 2E, a second gate oxide film 6 is formed on the first polycrystalline silicon film 5. This insulator film 6 is composed of for example a so called ONO multilayer film (formed of an oxide film/nitride film-/oxide film) having a total thickness of 100 Å to 400 Å. Furthermore, a second polycrystalline silicon film 7 and a second insulator film 8 are deposited.

Figure 2F:
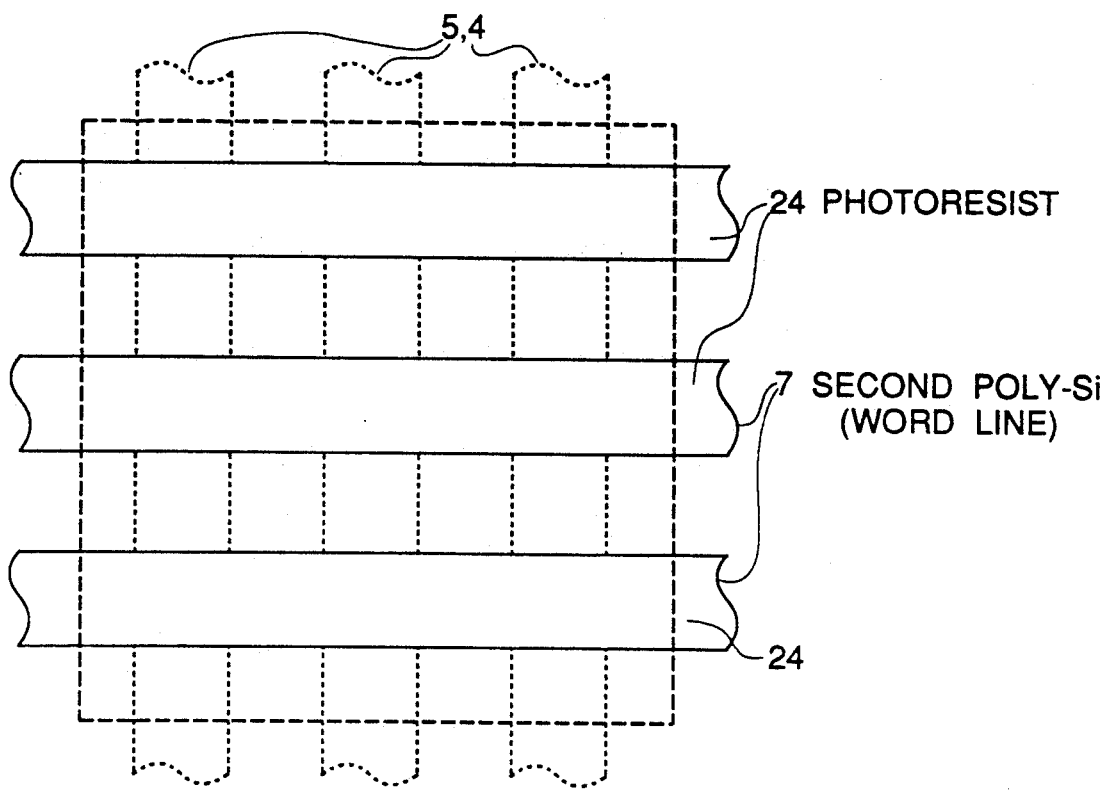

As shown in the plan view of FIG. 2F, a photoresist 24 having a stripe pattern in the lateral direction is formed by using a known photolithography technique, and by using the photoresist 24 as a mask, the second insulator film 8 and the second polycrystalline silicon film 7 are sequentially etched so as to form a plurality of lateral lines separated from and in parallel to each other and each having a stacked structure composed of the two layers 8 and 7. The patterned lateral lines of the second polycrystalline silicon film form the word lines 7, which are orthogonal to the lines of the device isolation regions 3. At this stage, the photoresist 24 on the word line 7 is maintained.

Figure 2G:
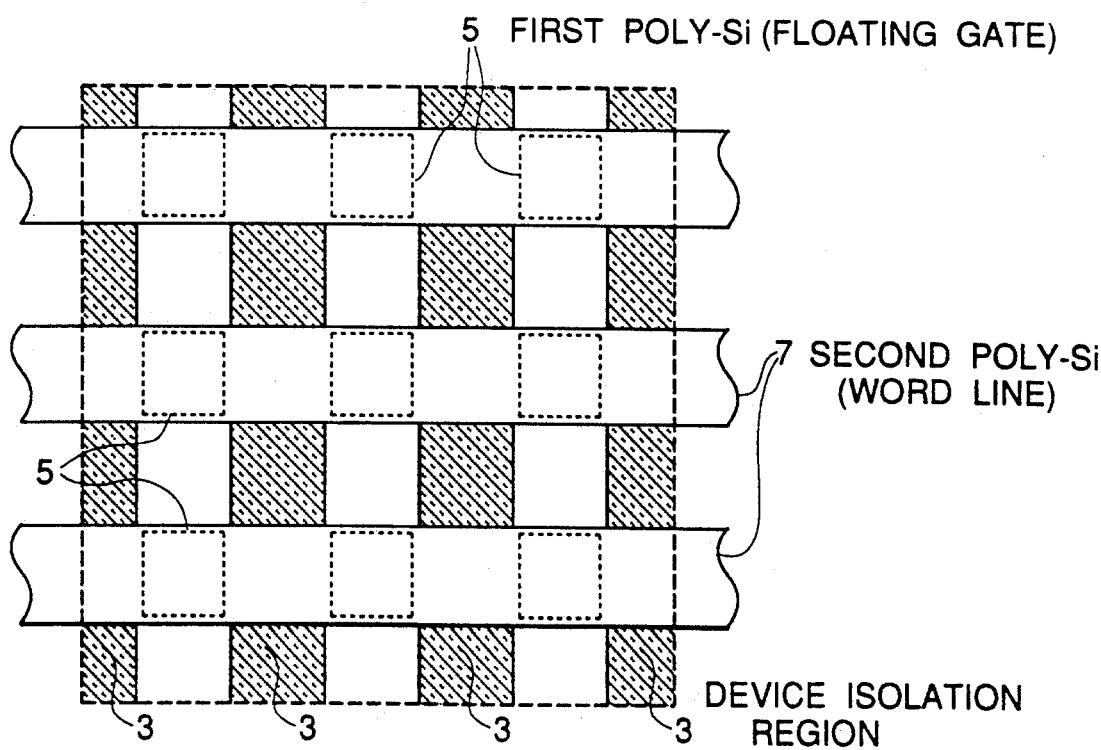

As shown in FIG. 2G, the second gate oxide film 6 and the first polycrystalline silicon film 5 are removed by etching in a self alignment to the word lines 7, so that the second gate oxide film 6 and the first polycrystalline silicon film 5 between the word lines are completely removed. As a result, a plurality of floating gates formed of the first polycrystalline silicon film 5 are formed within the device formation regions at positions directly underneath the word lines 7.

Figure 2H:
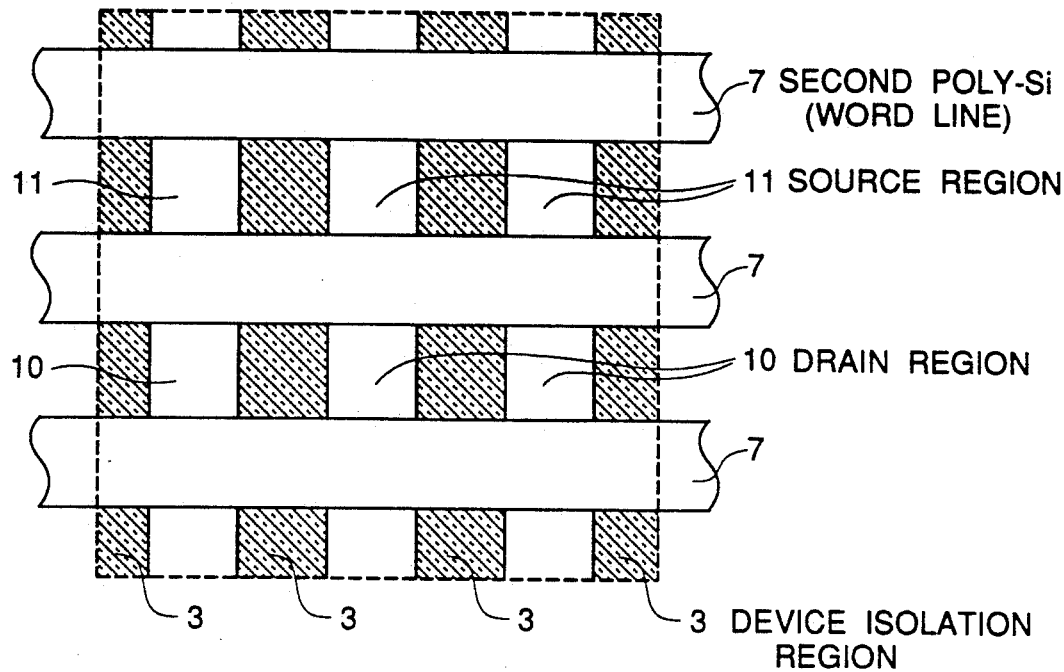

Thereafter, as shown in FIG. 2H, the photoresist 24 is removed, and N-type impurities are doped, for example by implanting ions into the substrate 1 in a self alignment manner by using the word lines 7 as a mask. As a result, a plurality of N-type drain regions 10 and a plurality of P-type source regions 11 are formed. In FIG. 2H, depiction of the first gate oxide on the drain regions 10 is omitted for simplification of the drawing.

Figure 2I:
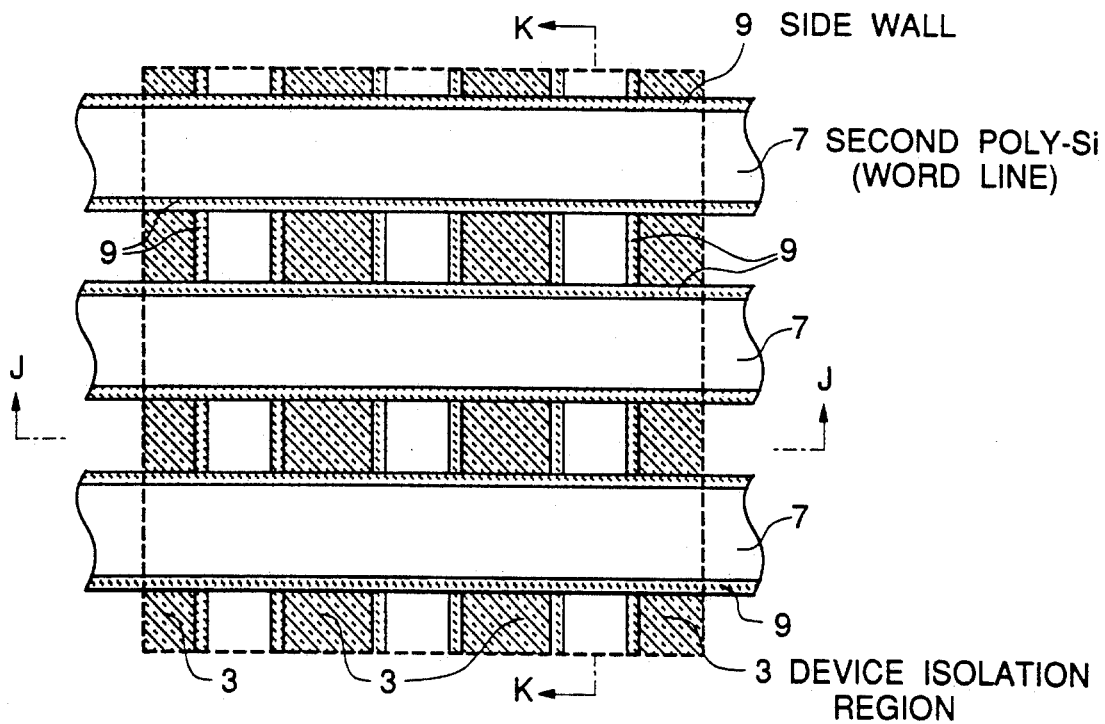
Figure 2J:
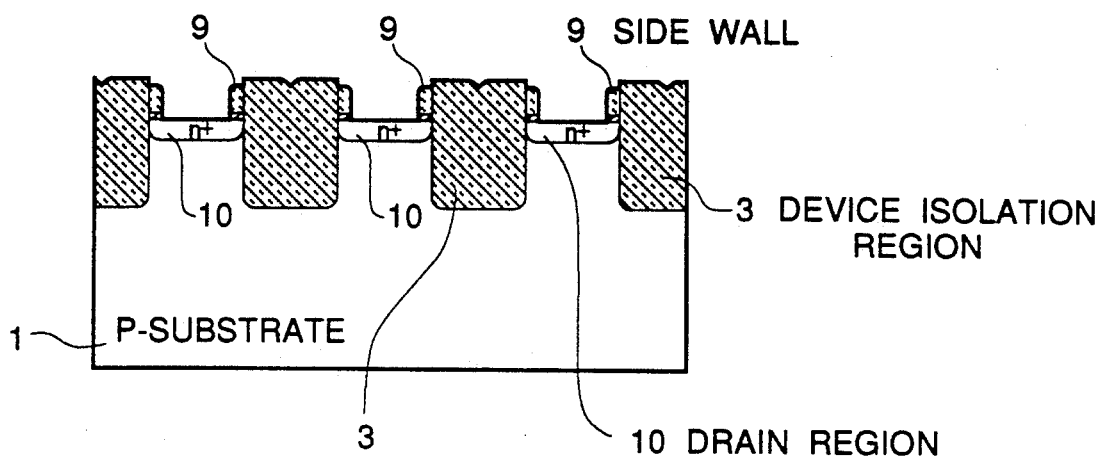
Figure 2K:
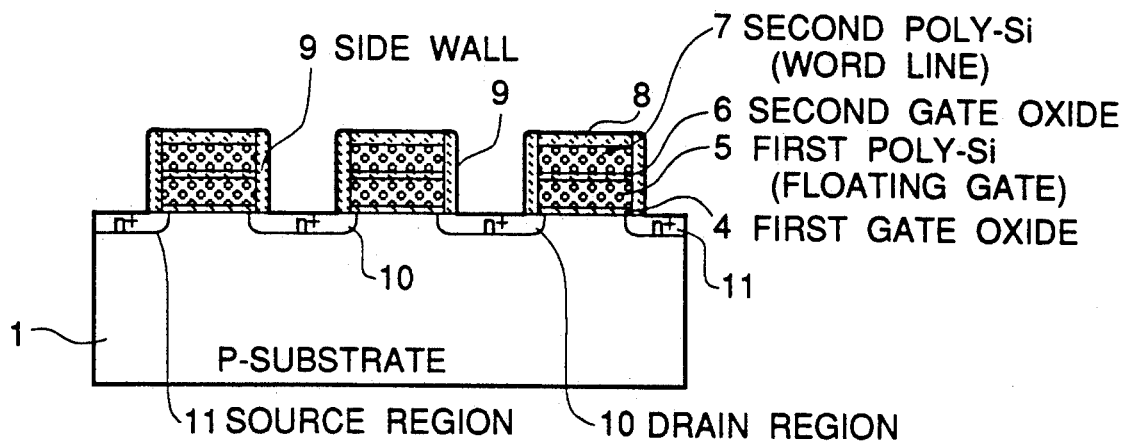

An oxide film having a thickness of for example 1000 Å to 5000 Å is deposited on the whole surface of the substrate, and an appropriate anisotropic etching is performed so that a side wall 9 is formed on side surfaces of the word lines 7 and the floating gates 5, as shown in FIG. 2I. The side wall 9 is more apparent from FIGS. 2J and 2K, which are sectional views taken along the lines J—J and K—K in FIG. 2I, respectively.

Figure 2L:
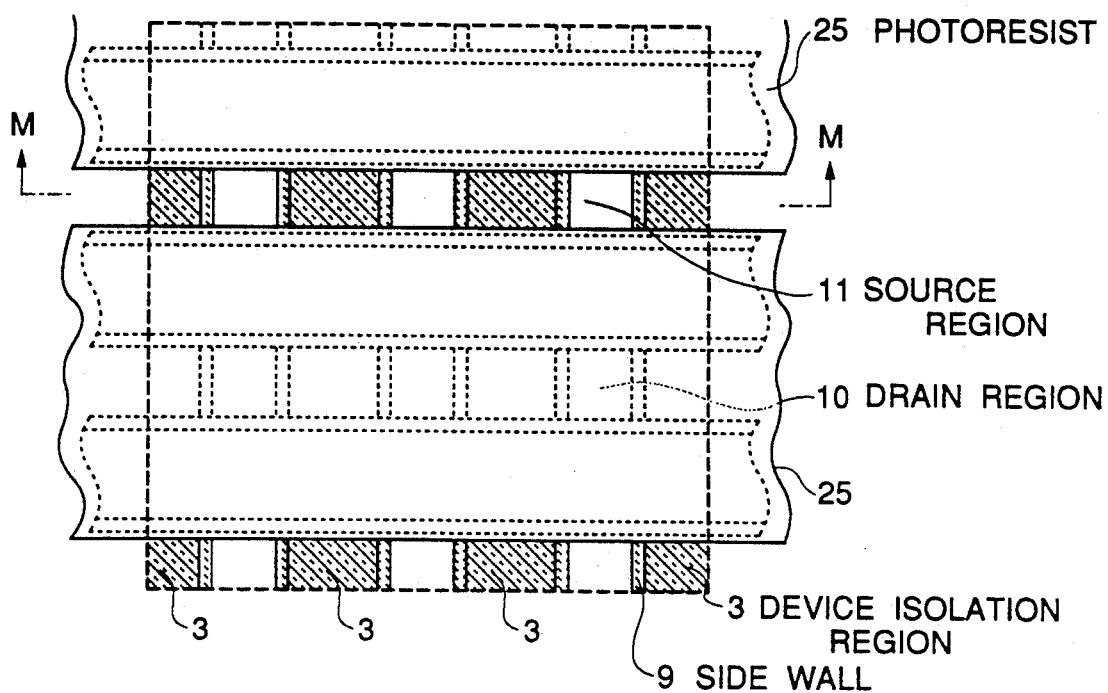
Figure 2M:
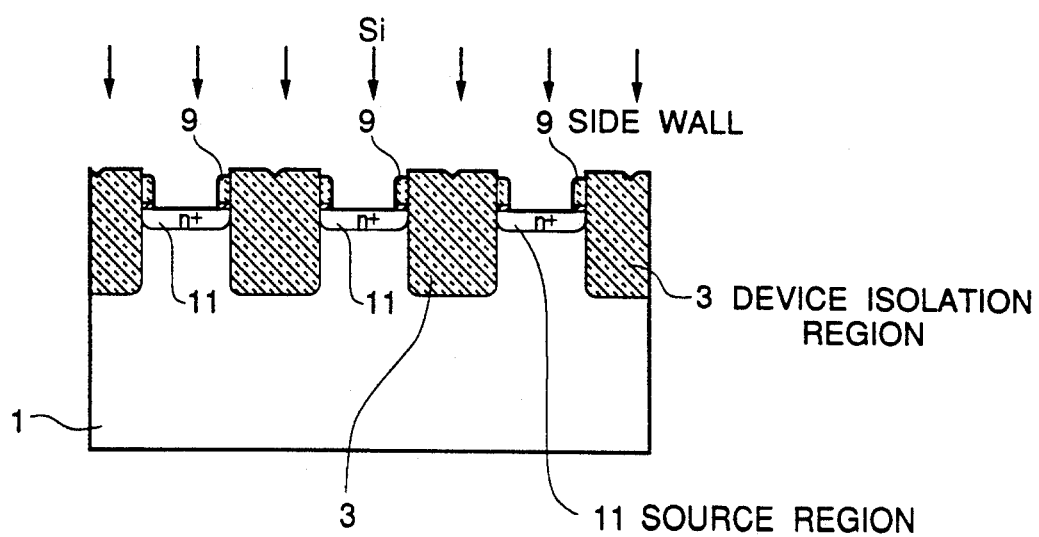

As shown in FIG. 2L, and in FIG. 2M which is a sectional view taken along the line M—M in FIG. 2L, the substrate surface is selectively covered with a photoresist 25 in such a manner that the word lines 7 and the drain regions 10 between the word lines 7 are covered with the photoresist 25, but the source regions between the word lines 7 are not covered with the photoresist 25. Then, silicon ions are implanted with a dose of $1 \times 10^{17}$ cm$^{-2}$ under an acceleration voltage of 25 KeV, so that silicon atoms 26 is introduced into a surface of the insulator film of the device isolation regions 3 positioned at the source region side.

Figure 2N:
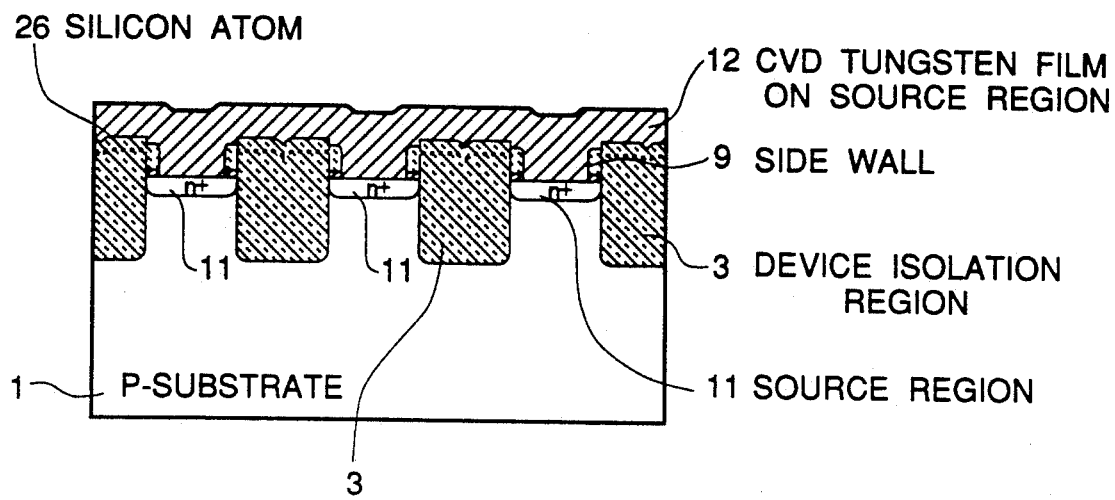
Figure 2O:
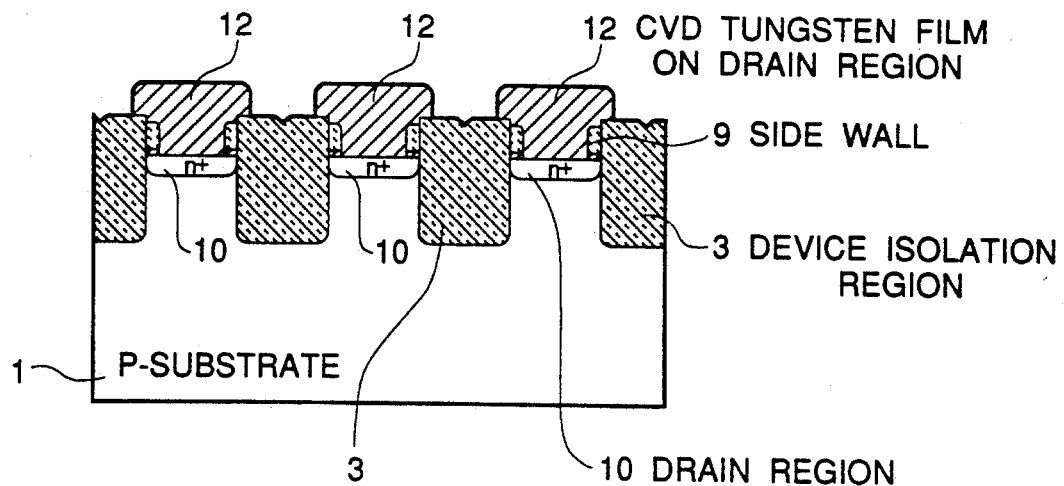

As shown in FIGS. 2N and 2O, a CVD tungsten film 12 having a thickness of 5000 Å to 10,000 Å is selectively grown. As shown in FIG. 2N, the CVD tungsten film 12 is grown not only on the N-type source regions 11 but also on the device isolation regions 3 ion-implanted with the silicon atoms, so that the N-type sources regions 11 adjacent to each other through the device isolation regions 3 are continuously interconnected by the CVD tungsten film 12. Incidentally, the technique for selectively growing the CVD tungsten film on the oxide film by previously ion-implanting silicon into the oxide film surface is disclosed in "Selective CVD Tungsten on Silicon Implanted SiO$_2$", Journal of Electrochemical Society, July 1988, p1730.

In the drain region side, on the other hand, the CVD tungsten film 12 is grown only the drain region 10 surrounded by the side wall 9, and therefore, the N-type drain regions 12 adjacent to each other through the device isolation regions 3 remains separated from each other.

Figure 2P:
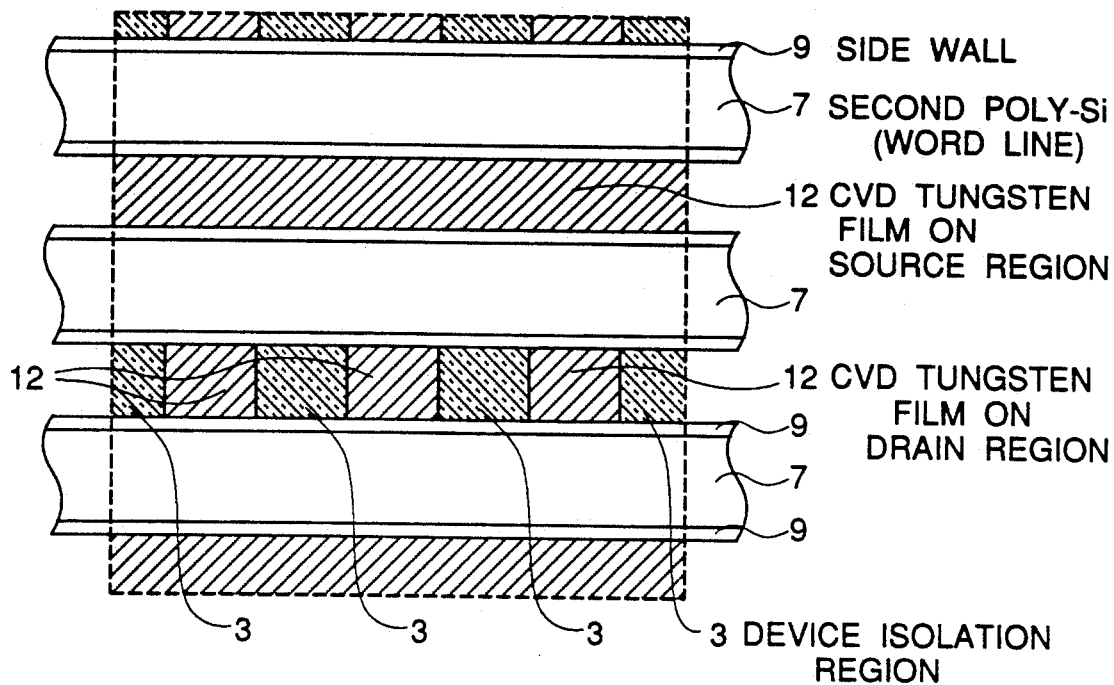

The condition on the substrate at this stage is shown in FIG. 2P.

Figure 2Q:
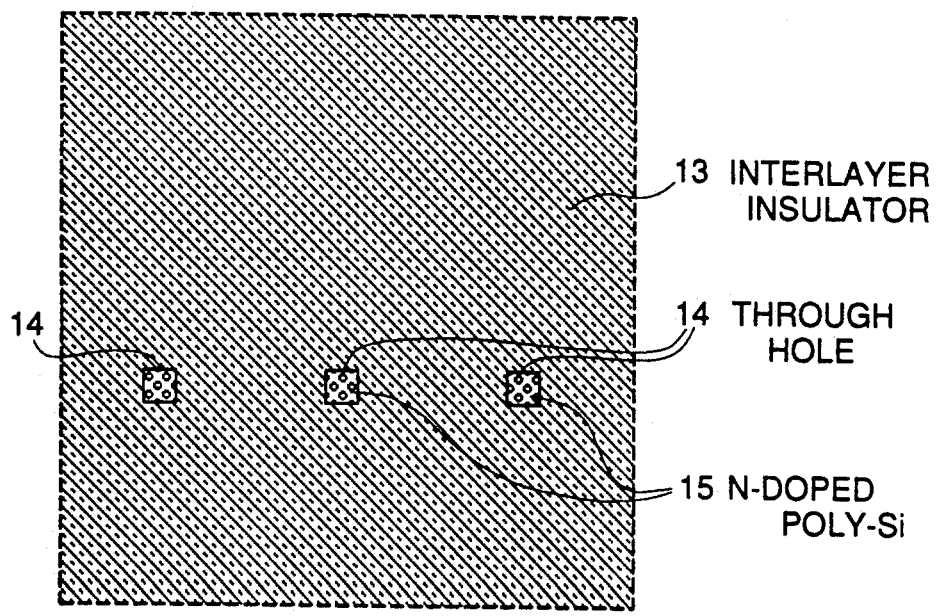

Thereafter, as shown in FIG. 2Q, the interlayer insulator film 13 is deposited, and the contact holes 14 are formed above the drain regions 10. Furthermore, an N-doped polycrystalline silicon film 15 is filled into the contact holes 14. Thereafter, aluminum conductors 16 are formed as shown in FIGS. 1A to 1E.

In the above mentioned semiconductor memory, since the side wall 9 of the insulator film is formed on the side surfaces of the word line 7, the side wall 9 can prevent the word line 7 and the source 11 from overlapping each other. As a result, it becomes unnecessary to provide a margin region for the overlapping between the word lines and the device isolation regions. Accordingly, the scale of the memory cell array in the longitudinal direction can be reduced.

In addition, since the CVD tungsten film 12 is provided to extend over the source regions, even if the width of the source regions (in the longitudinal direction) is reduced, it is possible to maintain a source resistance at a low value. Accordingly, the writing characteristics and the reading characteristics of the memory cell is never deteriorated. In this case, since the CVD tungsten film on the drain regions are separated from each other, the drain regions are not short-circuited.

Accordingly, a high integration density can obtained without deteriorating the characteristics of the semiconductor memory.

The above mentioned process for manufacturing the semiconductor memory can be modified as shown in FIGS. 3A to 3D.

Figure 3A:
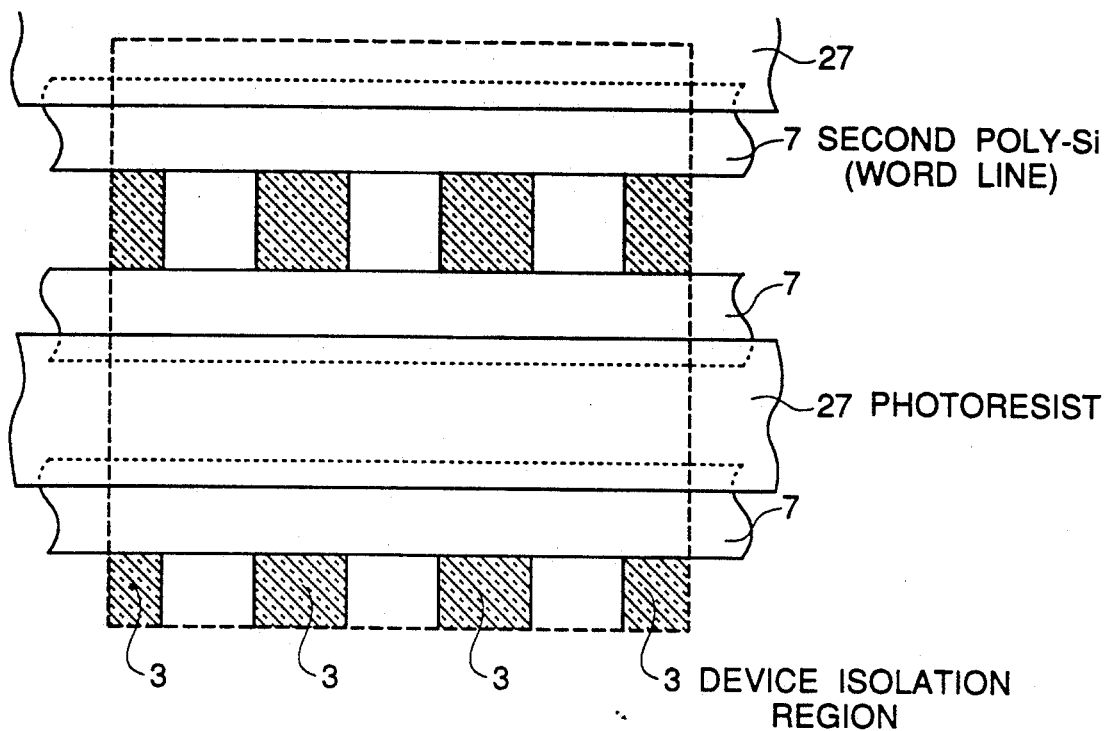
FIGS. 3A to 3D are diagrammatic plan view and sectional views illustrating some steps of a second embodiment of the method for manufacturing the double gate type non-volatile semiconductor memory in accordance with the present invention.

Namely, after the manufacturing process has advanced to the condition shown in FIG. 2G, as shown in FIG. 3A a photoresist 27 is deposited to cover only the drain regions between the word lines 7, and then, an appropriate anisotropic etching is performed so that the device isolation regions 3 and the semiconductor substrate 1 at the source region sides are etched a depth of for example 3000 Å to 8000 Å.

Figure 3B:
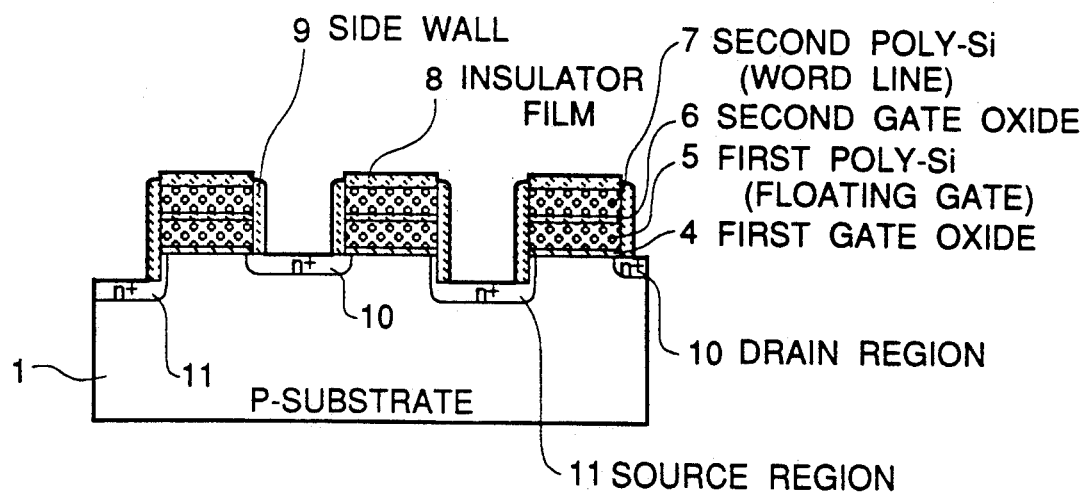

Thereafter, the manufacturing process is further advanced similarly to the above mentioned embodiment. In the condition corresponding to that shown in FIG. 2K, the configuration as shown in FIG. 3B is obtained.

Figure 3C:
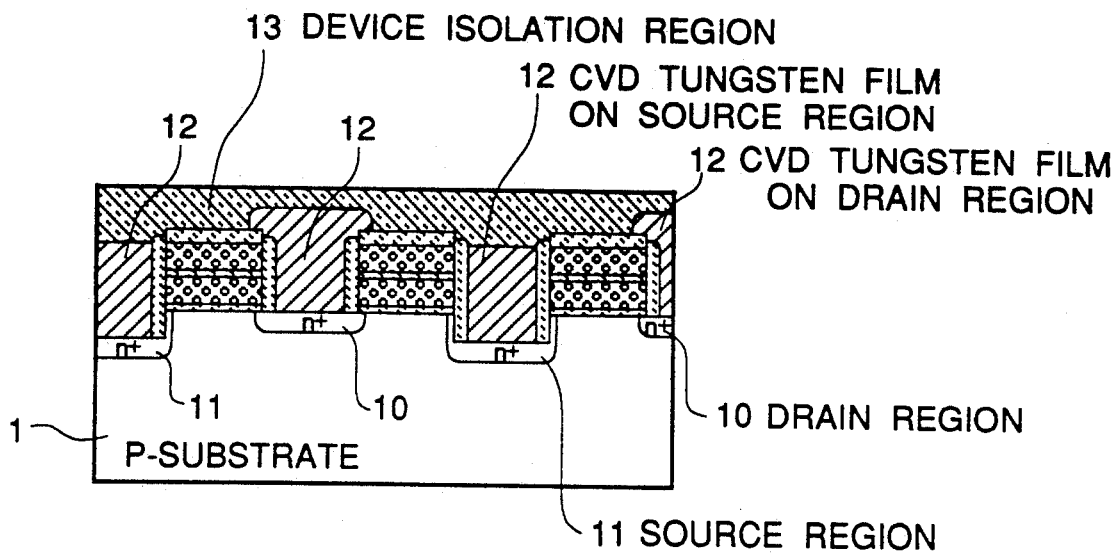

Thereafter, as shown in FIG. 3C, the CVD tungsten selective growth is performed. With this processing, since the surface of the drain region 10 (not further etched) is higher than the surface of the source region 11 (further etched), the CVD tungsten film on the drain regions 10 protrudes higher than the CVD tungsten film on the source regions 11. Then, a silica coating film is applied to form a flat interlayer insulator film 13.

Figure 3D:
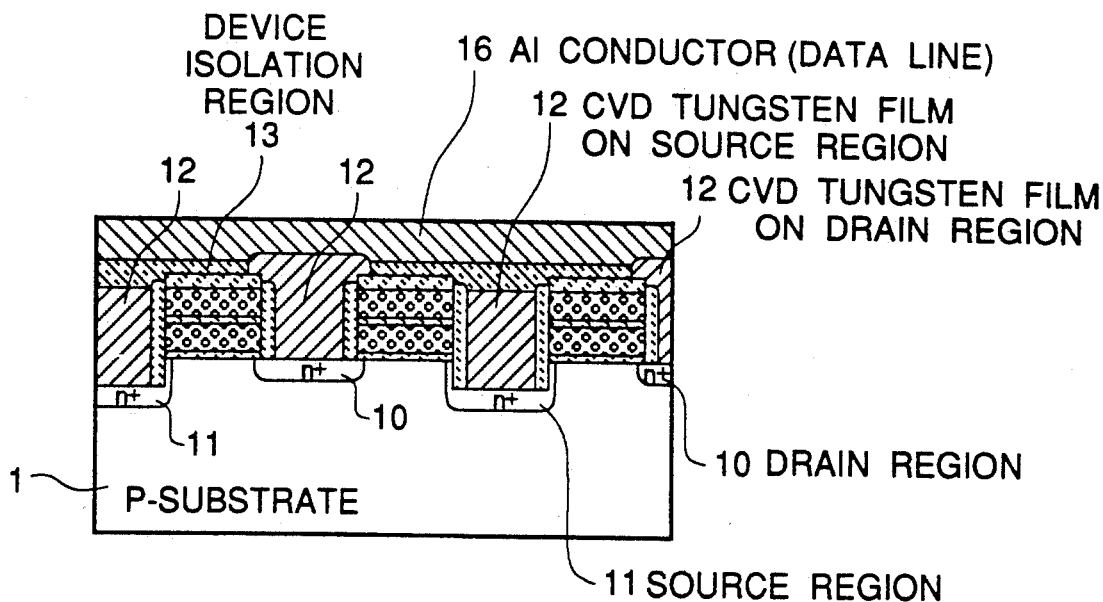

The interlayer insulator layer 13 is suitably etched back so that only the CVD tungsten film on the drain regions 10 is exposed, and as shown in FIG. 3D, the aluminum conductor 16 is formed.

In the semiconductor memory manufactured in accordance with this modified process, since the drain contact is formed in self alignment to the CVD tungsten film on the drain regions 10, it is no longer necessary to conserve a margin for the overlapping or alignment between the drain contact and the CVD tungsten film on the drain regions 10. Accordingly, a memory cell array having a further high integration density can be obtained.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory comprising:

a substrate having a principal surface and plurality of trenches formed in said principal surface, said trenches being separated from each other at a predetermined interval and extending in a first direction in the form of a line, each of said trenches extending from said principal surface into a body of said substrate, a plurality of device isolation regions formed on an insulator material filled into said plurality of trenches, so as to form a plurality of device formation regions, each of said device formation regions being located between a corresponding pair of adjacent device isolation regions;

a plurality of floating gates formed at predetermined positions in said device formation region with a first gate oxide being interposed between a surface of said device formation region and each of said floating gates;

a plurality of word lines formed on the floating gates with a second gate oxide being interposed between each of said word lines and each of corresponding ones of said floating gates, said word lines extending in a second direction orthogonal to said first direction so as to intersect said device isolation regions;

a side wall formed of an insulator material so as to cover side surfaces of the word lines and the floating gates;

source regions and drain regions having doped impurities and formed in the device formation regions surrounded by said side wall, said source regions forming a plurality of rows extending in said second direction, and said drain regions also forming a plurality of rows extending in said second direction;

a plurality of common source lines formed of a low resistance conductor film each extending in said second direction so as to pass on the source regions positioned in each one row of said second direction and in alignment with the one row of the source regions and in an electrical contact with each of the source regions of the one row;

a connection layer formed of a low resistance conductor film, said connection layer being provided on each individually associated one of said drain regions independently of any connection layer formed on any of the other drain regions;

an insulator layer formed to cover said common word lines and said connection layers and a plurality of data lines formed on said insulator layer to extend in said first direction, each of said data lines being connected to said individually associated one of said connection layers above said drain regions, said data line connections being made through a contact hole formed in said insulator layer on said connection layer.

2. A semiconductor memory comprising:

a substrate having a principal surface and plurality of trenches formed in said principal surface, said trenches being separated from each other at a predetermined interval and extending in a first direction in the form of a line, each of said trenches extending from said principal surface into a body of said substrate, a plurality of device isolation regions formed on an insulator material filled into said plurality of trenches, so as to form a plurality of device formation regions, each of said device formation regions being located between a corresponding pair of adjacent device isolation regions;

a plurality of floating gates formed at predetermined positions in said device formation region with a first gate oxide being interposed between a surface of said device formation region and each of said floating gates;

a plurality of word lines formed on the floating gates with a second gate oxide being interposed between each of said word lines and each of corresponding ones of said floating gates, said word lines extending in a second direction orthogonal to said first direction so as to intersect said device isolation regions;

a side wall formed of an insulator material so as to cover side surfaces of the word lines and the floating gates;

source regions and drain regions having doped impurities and formed in the device formation regions surrounded by said side wall, said source regions forming a plurality of rows extending in said second direction, and said drain regions also forming a plurality of rows extending in said second direction;

a plurality of common source lines formed of a low resistance conductor film each extending in said second direction so as to pass on the source regions positioned in each one row of said second direction and in alignment with the one row of the source regions and in an electrical contact with each of the source regions of the one row;

a connection layer formed of a low resistance conductor film, said connection layer being provided on each individually associated one of said drain regions independently of any connection layer formed on any of the other drain regions;

an insulator formed to cover said common word lines and said connection layers and a plurality of data lines formed on said insulator layer to extend in said first direction, each of said data lines being connected to said individually associated one of said connection layers above said drain regions, said data line connections being made through a contact hole formed in said insulator layer on said connection layer said drain regions having an upper surface which is higher than an upper surface of said source regions, and said common source lines and said connection layers having substantially the same thickness, and said insulator layer being formed to cover said common source lines and to expose said connection layers, and said data lines being formed to pass over and make contact with said connection layers which are exposed from said insulator layer.

* * * * *